United States Patent
Emer et al.

(10) Patent No.: US 9,915,871 B2
(45) Date of Patent: Mar. 13, 2018

(54) METHOD FOR MEASURING AN ANGULARLY RESOLVED INTENSITY DISTRIBUTION AND PROJECTION EXPOSURE APPARATUS

(71) Applicant: Carl Zeiss SMT GmbH, Oberkochen (DE)

(72) Inventors: Wolfgang Emer, Aalen (DE); Dirk Hellweg, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 33 days.

(21) Appl. No.: 14/796,328

(22) Filed: Jul. 10, 2015

(65) Prior Publication Data

US 2016/0011520 A1 Jan. 14, 2016

Related U.S. Application Data

(63) Continuation of application No. 13/935,972, filed on Jul. 5, 2013, now Pat. No. 9,081,294.

(30) Foreign Application Priority Data

Jul. 6, 2012 (DE) .................. 10 2012 211 846

(51) Int. Cl.
*G01B 9/00* (2006.01)
*G03F 7/20* (2006.01)
*G01J 1/42* (2006.01)

(52) U.S. Cl.
CPC ........ *G03F 7/70133* (2013.01); *G01J 1/4257* (2013.01); *G03F 7/70191* (2013.01)

(58) Field of Classification Search
CPC . G01J 1/4257; G03F 7/70133; G03F 7/70191
(Continued)

(56) References Cited

U.S. PATENT DOCUMENTS

| 7,236,254 B2 | 6/2007 | Kakuchi et al. |
| 2004/0145714 A1 | 7/2004 | Poultney |

(Continued)

FOREIGN PATENT DOCUMENTS

| DE | 102008003916 A1 | 7/2008 |
| DE | 102008042463 B3 | 4/2010 |

(Continued)

OTHER PUBLICATIONS

Office Action in corresponding German Application No. 10 2012 211 846.2, dated Jan. 24, 2013, along with an English translation.

(Continued)

*Primary Examiner* — Tri T Ton
(74) *Attorney, Agent, or Firm* — Edell, Shapiro & Finnan, LLC

(57) ABSTRACT

A method for measuring an angularly resolved intensity distribution in a reticle plane (24) of a projection exposure apparatus (10). The apparatus includes an illumination system (16), irradiating a reticle (22) arranged in the reticle plane (24) and having a first pupil plane (20). All planes of the projection exposure apparatus which are conjugate thereto are further pupil planes, and the reticle plane (24) and all planes which are conjugate thereto are field planes. The method includes: arranging a spatially resolving detection module (44) in the region of one of the field planes (24, 30) such that the detection module is at a smaller distance from this field plane than from the closest pupil plane (20), radiating electromagnetic radiation (21) onto an optical module (42) from the illumination system, and determining an angularly resolved intensity distribution of the radiation from a signal recorded by the detection module.

16 Claims, 7 Drawing Sheets

Related U.S. Application Data

(60) Provisional application No. 61/668,554, filed on Jul. 6, 2012.

(58) Field of Classification Search
USPC .................................................. 356/124–137
See application file for complete search history.

(56) References Cited

U.S. PATENT DOCUMENTS

| | | |
|---|---|---|
| 2006/0012799 A1 | 1/2006 | Wegmann |
| 2007/0139634 A1 | 6/2007 | Mulder |
| 2007/0279642 A1 | 12/2007 | Shmarev |
| 2008/0007705 A1 | 1/2008 | Smith et al. |
| 2009/0161088 A1 | 6/2009 | Hansen et al. |
| 2010/0020302 A1 | 1/2010 | Freimann |
| 2010/0079738 A1 | 4/2010 | Eisenmenger et al. |
| 2011/0199598 A1* | 8/2011 | Solak .................... G03B 27/58 355/67 |

FOREIGN PATENT DOCUMENTS

| | | |
|---|---|---|
| WO | 2005026843 A2 | 3/2005 |
| WO | 2009080279 A1 | 7/2009 |

OTHER PUBLICATIONS

M.P. Rimmer, et al., Evaluation of Large Aberrations Using a Lateral-Shear Interferometer Having Variable Shear, Applied Optics, vol. 14, pp. 142-150, Jan. 1975.

Joe Kirk, et al., Pinholes and Pupil Fills, Feature, Autumn 1997, pp. 25-28 and 34.

* cited by examiner (a)  (b)

METHOD FOR MEASURING AN ANGULARLY RESOLVED INTENSITY DISTRIBUTION AND PROJECTION EXPOSURE APPARATUS

CROSS REFERENCE TO RELATED APPLICATIONS

This application is a continuation of U.S. patent application Ser. No. 13/935,972, filed Jul. 5, 2013, which claims benefit under 35 U.S.C. §119(e) to U.S. Provisional Application No. 61/668,554, filed Jul. 6, 2012, and which claims priority under 35 U.S.C. §119(a) to German Patent Application No. 10 2012 211 846.2, also filed on Jul. 6, 2012. The disclosures of these related applications are hereby incorporated into the present application by reference in their respective entireties.

FIELD OF AND BACKGROUND OF THE INVENTION

The invention relates to a method for measuring an angularly resolved intensity distribution in a reticle plane of a projection exposure apparatus for microlithography, and to a projection exposure apparatus comprising a measurement system for measuring an angularly resolved intensity distribution. Furthermore, the invention relates to a method for measuring a beam divergence in an illumination system of a projection exposure apparatus for microlithography, and to a projection exposure apparatus.

Lenses of projection exposure apparatuses for microlithography are being operated with ever smaller k1 factors. This has the consequence that a precise measurement and specification of the illumination system of such projection exposure apparatuses is becoming more and more important. Such an illumination system irradiates a reticle to be imaged with a previously selected angular distribution. The angular distribution chosen is also designated as an illumination setting. Examples of such illumination settings include annular illumination, dipole illumination and quadrupole illumination. In particular, it is important to be able to characterize the illumination setting even when the projection lens and the illumination system are integrated in a projection exposure apparatus.

The illumination setting in a projection exposure apparatus is conventionally characterized by measuring a so-called "pupilogram" with a sensor integrated in the wafer stage of the projection exposure apparatus. A definition of a pupilogram is included e.g. in the article by Joe Kirk and Christopher Progler "Pinholes and pupil fills", Microlithography World, Autumn 1997, pages 25 to 34. In order to generate the pupilogram, a special measurement reticle with pinhole structures arranged thereon is loaded into the reticle plane of the projection exposure apparatus. The above-mentioned sensor is generally arranged for measurement purposes below the wafer plane, to be precise in a conjugate pupil plane of the projection lens. This has the effect that the intensity distribution which is present in the pupil plane and which corresponds to the angularly resolved intensity distribution in the reticle plane is imaged on the sensor.

If this method is used during the projection operation of the projection exposure apparatus, then generally a relatively significant time delay arises since firstly the production reticle has to be removed from the wafer stage and the pinhole reticle has to be loaded for carrying out the measurement. Furthermore, in the case of generally older projection exposure apparatuses, the problem often arises that such apparatuses are not provided with a suitable sensor arranged below the wafer plane for carrying out the pupilogram measurement.

OBJECTS AND SUMMARY OF THE INVENTION

It is an object of the invention to solve the problems mentioned above and, in particular, to provide a measuring method and a projection exposure apparatus whereby it is possible to measure the angularly resolved intensity distribution in the reticle plane during the projection operation of the projection exposure apparatus without thereby creating a long time delay.

The above object is achieved according to one formulation of the invention for example by the method mentioned below for measuring an angularly resolved intensity distribution in a reticle plane of a projection exposure apparatus for microlithography. The projection exposure apparatus comprises an illumination system, which is configured for irradiating a reticle arranged in the reticle plane and has a first pupil plane. All planes of the projection exposure apparatus which are conjugate with respect to the first pupil plane are further pupil planes. The reticle plane and all planes which are conjugate with respect thereto are field planes. The method according to this formulation of the invention comprises: arranging an optical module in the beam path of the projection exposure apparatus, and arranging a spatially resolving detection module in the region of one of the field planes in such a way that the detection module is at a smaller distance from this field plane than from the closest pupil plane. Furthermore, the method comprises: radiating electromagnetic radiation onto the optical module with the illumination system, and determining an angularly resolved intensity distribution of the radiated radiation from a signal recorded by the detection module.

In other words, according to this formulation of the invention, the angularly resolved intensity distribution in the reticle plane is measured with an optical module and a detection module. The detection module is disposed downstream of the optical module in the beam path of the projection exposure apparatus. The detection module is arranged in the region of one of the field planes of the projection exposure apparatus, for example in the reticle plane or the wafer plane. In this case, an arrangement in the region of one of the field planes is understood to mean that the distance between the detection module, in particular a detection area of the detection module, and the relevant field plane is smaller than the distance between the detection module and the closest pupil plane. In particular, the distance between the detection module and the relevant field plane is a maximum of half, in particular a maximum of one quarter, of the distance between the detection module and the closest pupil plane. The detection module is therefore situated substantially in the near field of the corresponding field plane.

In accordance with the method according to this formulation of the invention, for example, the optical module together with the detection module can be inserted above the production reticle loaded from the reticle stage. It is thus possible to carry out the illumination setting during production operation, e.g. between the exposure of two wafers, without further loss of time. Moreover, according to the method according to the invention it is not necessary to provide a sensor arranged below the wafer plane in the wafer displacement stage, also called wafer stage. Therefore, the method according to the invention can be carried out, in particular, also in the case of older projection exposure apparatuses which do not have a corresponding sensor incorporated in their wafer displacement stage.

In accordance with one embodiment according to the invention, the optical module is arranged in the region of one of the field planes in such a way that the optical module, in particular the upper edge of the optical module that is irradiated during the measurement, is at a smaller distance from this field plane than from the closest pupil plane. In particular, the optical module is arranged in the region of one of the field planes in such a way that the optical module is at a distance of a maximum of half, in particular a maximum of one quarter, of the distance between the optical module and the closest pupil plane.

In accordance with a further embodiment according to the invention, the optical module of the detection module is arranged in the region of the same field plane. The optical module and the detection module can thus be integrated into a measurement system with a compact construction.

In accordance with a further embodiment according to the invention, the optical module is arranged in the region of the reticle plane during the measurement. This makes it possible to measure the angularly resolved intensity distribution particularly precisely, since no corruption can occur for instance as a result of imaging aberrations of interposed optical elements. In accordance with a further embodiment according to the invention, the detection module is likewise arranged in the region of the reticle plane.

In accordance with a further embodiment according to the invention, the optical module comprises two diffraction gratings arranged successively in the beam path of the incoming radiation. Preferably, the measurement system comprising the optical module and the detection module is designed as a shearing interferometer. In accordance with one embodiment, the relative situation and thus the relative position and/or the relative orientation of the phase gratings with respect to one another is varied during the measurement of the intensity distribution.

In accordance with a further embodiment according to the invention, a spatial coherence function is recorded by the detection module and the spatial coherence function is thereupon converted into the angularly resolved intensity distribution in the reticle plane. The conversion can be effected using the van cittert-zernike theorem.

In accordance with a further embodiment according to the invention, the optical module comprises a focusing optical element, with which the radiated radiation is focused onto the detection module. The detection module is thus arranged in the region of a focal plane of the focusing optical element.

In accordance with a further embodiment, already discussed above, according to the invention, for the purpose of measuring the angularly resolved intensity distribution, a measurement system comprising the optical module and the detection module is inserted into the beam path of the radiated radiation above a reticle arranged in the reticle plane. In the case of this variant, the angularly resolved intensity distribution can be measured with a product reticle arranged in the reticle plane.

In accordance with a further embodiment according to the invention, the optical module is fixed to an edge region of a reticle displacement stage of the projection exposure apparatus, in particular integrated into the edge region. In this context, an edge region should be understood to mean a region of the reticle which, with the reticle loaded, is not concealed by the latter.

In accordance with a further embodiment according to the invention, the angularly resolved intensity distribution is measured for a plurality of field points in the reticle plane simultaneously.

In accordance with a further embodiment according to the invention, the detection module comprises an integral spatially resolving area sensor. An appropriate spatially resolving area sensor is a CCD sensor, for example.

In accordance with a further embodiment according to the invention, the detection module comprises at least two point sensors separated from one another. By way of example, a four-quadrant diode can be used.

In accordance with a further embodiment according to the invention, the optical module comprises a shadow casting element, which is at least partly non-transmissive to the radiated radiation, such that at least one shaded region is generated on a detection module. For the purpose of determining the angularly resolved intensity distribution, the position of a transition from the shaded region to an unshaded region adjacent thereto is determined using the detection module. In accordance with one variant, the shadow casting element is designed as a grating. Furthermore, the detection area of the detection module can be provided with measurement markings in the form of a further grating.

In accordance with a further embodiment according to the invention, the optical module has a pole selection device, which comprises a pinhole stop and a blocking element for blocking part of the radiated radiation, said blocking element being offset with respect to said pinhole stop in a direction transversely with respect to the reticle plane. The blocking element can be configured e.g. as a stop.

The abovementioned object can be achieved according to a further formulation of the invention with a projection exposure apparatus for microlithography. The projection exposure apparatus according to the invention comprises an illumination system, which is configured for irradiating a reticle arranged in a reticle plane of the projection exposure apparatus with electromagnetic radiation. The illumination system has a first pupil plane, wherein all planes which are conjugate with respect to the first pupil plane are further pupil planes of the illumination system. The reticle plane and all planes which are conjugate with respect thereto are field planes. The projection exposure apparatus according to the invention furthermore comprises a measurement system, which has an optical module and a detection module and is configured for measuring an angularly resolved intensity distribution of the radiated radiation in the reticle plane. Furthermore, the projection exposure apparatus comprises a positioning device for arranging the detection module in the region of one of the field planes in such a way that the detection module is at a smaller distance from this field plane than from the closest pupil plane. The optical module is configured according to the invention for generating a radiation distribution on the detection module arranged in the region of the field plane, from which radiation distribution it is possible to determine the angularly resolved intensity distribution in the reticle plane.

The explanations and features given above with regard to the method according to the invention can be applied to the projection exposure apparatus according to the invention.

In the development of lithography processes for the production of semiconductor chips, taking account of diffraction effects that occur during the imaging of the mask structures onto the wafer is often of great importance. Therefore, the mask structures on the production reticles used are correspondingly modified for the correction of said diffraction effects. This correction is generally designated as optical proximity correction (OPC). The optimization of the optical proximity correction conventionally often takes place on a reference exposure apparatus. However, the masks optimized via the reference exposure apparatus are subsequently used on a plurality of projection exposure apparatus. Therefore, there is a need to perform optical proximity corrections separately in a tailored manner with regard to each individual exposure apparatus. One parameter which significantly influences the optical proximity correction is the beam divergence of the exposure radiation in the input region of the illumination system of the projection exposure apparatus. Such an illumination system has a beam expanding optical unit for expanding the beam cross section of the exposure radiation emerging from a radiation source. The divergence of the beam directly downstream of the beam expanding optical unit has a considerable influence on the optical proximity correction.

In principle, it is conceivable to measure the beam divergence directly at the output of the beam expanding optical unit e.g. using suitably adapted sensors according to the Shack-Hartmann principle. However, such a measurement requires a service action at the projection exposure apparatus, which results in a production stoppage of the apparatus. Therefore, it is an aim to measure the beam divergence in an input region of the illumination system of a projection exposure apparatus with a high accuracy, without having to interrupt the operation of the exposure apparatus for a long time.

For this purpose, in accordance with a further aspect of the invention, a method for measuring a beam divergence in an illumination system of a projection exposure apparatus, for microlithography is provided, wherein the illumination system has a beam expanding optical unit for expanding the beam cross section of an exposure radiation emerging from a radiation source, and also a beam angle redistribution module for deflecting partial beams of the exposure radiation emerging from the beam expanding optical unit. The method according to this aspect of the invention comprises: exchanging at least one element of the beam angle redistribution module for a divergence amplification module, which is configured for amplifying the divergence of the beam emerging from the beam expanding optical unit, and measuring the illumination angle distribution in the reticle plane and determining the divergence of the exposure radiation emerging from the beam expanding optical unit from the measured illumination angle distribution.

Depending on the embodiment, the beam angle redistribution module can be formed by a diffractive optical element or else comprise a plurality of optical elements. As a result of the exchange according to the invention of an element of the beam angle redistribution module, in particular of the diffractive optical element, for a divergence amplification module, the divergence in an input section of the illumination system, in particular directly after the beam expanding optical unit, is increased in a predetermined manner.

As mentioned above, for example for optimizing the optical proximity correction of lithography masks there is great interest in accurately knowing the divergence in said input section of the illumination system, also designated hereinafter as input divergence. The divergence amplification according to the invention makes it possible to determine the input divergence with high accuracy using an angularly resolved measurement of the intensity distribution at a position disposed downstream of the illumination system in the beam path of the projection exposure apparatus.

Thus, by way of example, the measurement can be effected with the pupilogram measurement already mentioned above, which is known from the prior art and already provided in many projection exposure apparatuses. In accordance with one embodiment, for this purpose, a pinhole reticle is loaded into the reticle plane and the pupilogram generated is recorded by a sensor integrated in the wafer stage. The divergence at the location of the divergence amplification module is calculated from the recorded pupilogram. From this value in turn, the divergence amplification is calculated and the divergence in the input section of the illumination system during normal operation is thereby determined.

The divergence amplification according to the invention increases the effective accuracy of the measurement of the input divergence calculated back. Without the divergence amplification according to the invention for the input divergence, the pupilogram measuring method would only yield measurement results with low accuracy. The accuracy achievable in this case would not suffice for instance for optimizing the proximity correction of the reticle structures.

The invention thus opens up the possibility of using measuring systems already present in the projection exposure apparatus for the divergence measurement and thereby determining the required divergence measurement values in a cost-effective manner. Furthermore, it is also possible to carry out the input divergence measurement using a separate measurement system arranged in the region of the reticle plane, for example. In accordance with one embodiment according to the invention, for this purpose the measurement system is used in one of the variants according to the invention, that is to say that the illumination angle distribution in the reticle plane is measured using the measurement system described above.

In accordance with one embodiment—already discussed above—of the method according to the further aspect of the invention, the projection exposure apparatus has a projection lens for imaging mask structures from the reticle plane onto a wafer, and a wafer stage for holding the wafer, and the illumination angle distribution is measured with a detector module arranged at the wafer stage.

Furthermore, in accordance with the further aspect of the invention, a projection exposure apparatus for microlithography comprising a radiation source for generating exposure radiation, and an illumination system disposed downstream of the radiation source and serving for radiating the exposure radiation into a reticle plane of the projection exposure apparatus, is provided. The illumination system according to the invention comprises: a beam expanding optical unit for expanding the beam cross section of the exposure radiation emerging from the radiation source, a beam angle redistribution module for deflecting partial beams of the exposure radiation emerging from the beam expanding optical unit, a divergence amplification module for amplifying the divergence of the beam emerging from the beam expanding optical unit, and an exchanging device for exchanging at least one element of the beam angle redistribution module for the divergence amplification module.

In accordance with one embodiment, the projection exposure apparatus in accordance with the further aspect according to the invention has a projection lens for imaging mask structures from the reticle plane onto a wafer, a wafer stage for holding the wafer, and a system for measuring the illumination angle distribution in the reticle plane. The system comprises a detector module arranged at the wafer stage, said detector module being arranged in the region of the conjugate pupil plane of the projection lens during the measurement process. Preferably, for carrying out the measurement a measurement mask having punctiform structures is arranged in the reticle plane.

In a further embodiment—already discussed above—in accordance with the further aspect according to the invention, the beam angle redistribution module comprises a diffractive optical element. The exchanging device thus serves to replace the diffractive optical element by the divergence amplification module.

In a further embodiment in accordance with the further aspect according to the invention, the divergence amplification module comprises a microlens element array. In particular, the divergence amplification module is designed as a microstructured plate in which the microlens element array is formed by the microstructuring.

In a further embodiment in accordance with the further aspect according to the invention, the divergence amplification module comprises two microlens element arrays having different focal lengths. Preferably, the microlens element arrays are spaced apart from one another in such a way that the divergence amplification module acts as a telescope optical unit.

With regard to the further aspect of the invention, too, it holds true that the features specified with regard to the abovementioned embodiments of the method according to the invention can correspondingly be applied to the projection exposure apparatus according to the invention. Conversely, the features specified with regard to the abovementioned embodiments of the projection exposure apparatus according to the invention can correspondingly be applied to the method according to the invention.

BRIEF DESCRIPTION OF THE DRAWINGS

Exemplary embodiments according to the invention are explained in greater detail below with reference to the accompanying schematic drawings, in which.

DETAILED DESCRIPTION OF EXEMPLARY EMBODIMENTS ACCORDING TO THE INVENTION

In the exemplary embodiments described below, elements that are functionally or structurally similar to one another are as far as possible provided with the same or similar reference signs. Therefore, for understanding the features of the individual elements of a specific exemplary embodiment, reference should be made to the description of other exemplary embodiments or the general description of the invention.

Figure 1:
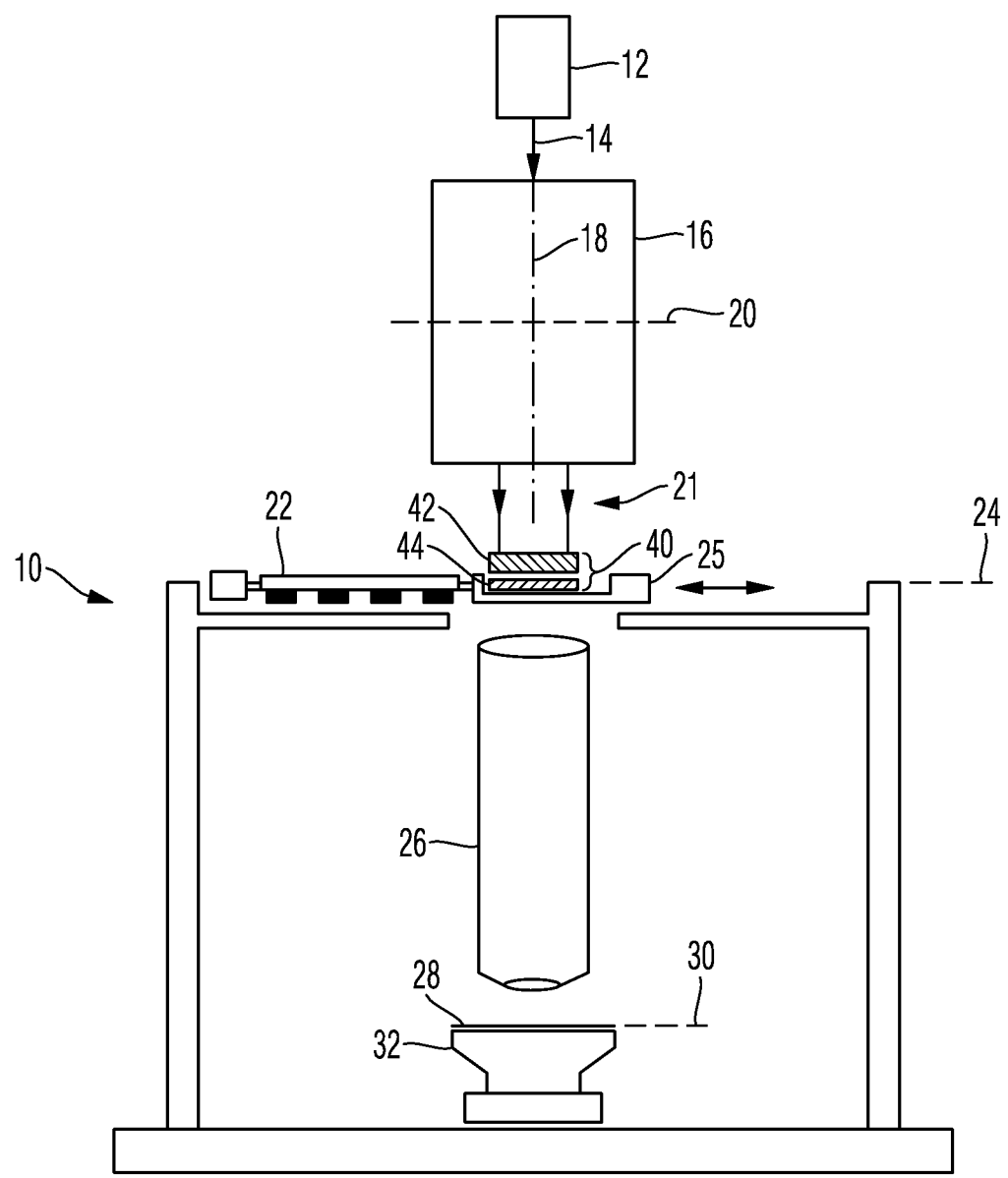
FIG. 1 shows a schematic illustration of an embodiment according to the invention of a projection exposure apparatus for microlithography comprising a system for measuring an angularly resolved intensity distribution in a reticle plane of the projection exposure apparatus.
Figure 1:
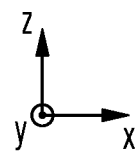

In order to facilitate the description, a Cartesian xyz coordinate system is indicated in the drawing and reveals the respective positional relationship of the components illustrated in the figures. In FIG. 1, y-direction runs perpendicularly to the plane of the drawing out of the latter, the x-direction runs toward the right, and the z-direction runs upward.

FIG. 1 schematically illustrates a projection exposure apparatus 10 for microlithography in a first embodiment according to the invention. The projection exposure apparatus 10 comprises, as is customary in the case of projection exposure apparatuses known from the prior art, a radiation source 12 for generating electromagnetic radiation 14 having a wavelength suitable for lithography of e.g. 365 nm, 248 nm or 193 nm. The projection exposure apparatus 10 can also be designed for radiation in the extreme ultraviolet wavelength range (EUV). In this case, the electromagnetic radiation 14 has a wavelength of <100 nm, e.g. approximately 13.5 nm.

An illumination system 16 is disposed downstream of the radiation source 12 and is configured for radiating the radiated electromagnetic radiation 14 with a predefined angular distribution onto a reticle 22 with mask structures arranged thereon. The predefined angularly resolved intensity distribution generated by the illumination system 16 is defined by the so-called illumination setting. Examples of illumination settings include annular illumination, quadrupole illumination or other, more complex illumination configurations.

The illumination system 16 has an optical axis 18 and generally comprises a plurality of optical elements. A pupil plane 20 is arranged within the illumination system 16, in which pupil plane the radiation distribution is Fourier-transformed relative to the reticle plane 24 of the projection exposure apparatus 10. The reticle 22 is held in a displaceable manner by a reticle displacement stage 25, also designated as "reticle stage", in the reticle plane 24.

The projection exposure apparatus 10 furthermore comprises a projection lens 26 for imaging the mask structures of the reticle 22 from the reticle plane 24 into a wafer plane 30. During an imaging process, a wafer 28 is arranged on a wafer displacement stage 32, also designated as "wafer stage", in the wafer plane 30.

According to the invention, the projection exposure apparatus 10 comprises a measurement system 40 for measuring the angularly resolved intensity distribution of the illumination radiation 21 radiated into the reticle plane 24. The measurement system 40 comprises an optical module 42 and a detection module 44. In the embodiment shown, the optical module 42 is arranged in the region of the reticle plane 24, to be precise in an edge region of the reticle displacement stage 25 that is provided therefor. The detection module 44 is situated directly below the optical module 42.

Figure 4:
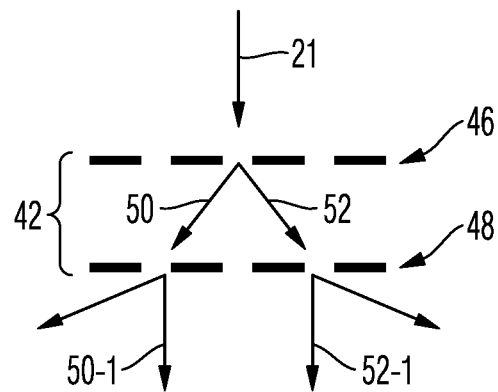
FIG. 4 shows a schematic sectional view of an embodiment according to the invention of an optical module of the measurement system in accordance with one of FIGS. 1 to 3.

In accordance with an embodiment illustrated in FIG. 4, the optical module 42 comprises two diffraction gratings 46 and 48 arranged successively in the beam path, as shown in FIG. 4. The incoming illumination radiation 21 is split by the first diffraction grating 46 into two partial beams 50 and 52 running obliquely with respect to one another. The two partial beams are pivoted by the second diffraction grating 48, such that they run parallel to one another again, as illustrated by the reference signs 50-1 and 52-1 in FIG. 4. Directly below the second diffraction grating 48, the interference of the two partial beams 50-1 and 52-1 occurs. The detection module records the interference pattern generated. The contrast of the recorded interference pattern contains the information about the spatial coherence of the illumination radiation 21.

The coherence function of the illumination radiation 21 is determined by the evaluation of the recorded interference pattern with an evaluation device. Preferably, a phase shifting technique is employed in order to increase the accuracy of the evaluation. For this purpose, e.g. the second diffraction grating 48 can be rotated with respect to the first diffraction grating 46 for the spatial phase shift. Alternatively, the two gratings can be moved with respect to one another.

In accordance with a further embodiment the measurements are carried out with different shear spacings, which are produced e.g. by the provision of different grating constants or grating spacings of the diffraction gratings. Furthermore, the measurements can be effected for different orientation directions of the diffraction gratings 46 and 48, e.g. for 0° and 90°.

The spatial coherence function determined is thereupon converted into the angularly resolved intensity distribution of the illumination radiation 21 in the reticle plane 24 using the van cittert-zernike theorem. The van cittert-zernike theorem is known to the person skilled in the art and describes the relationship between the extent of a light source and the spatial coherence of the radiation generated thereby.

Figure 2:
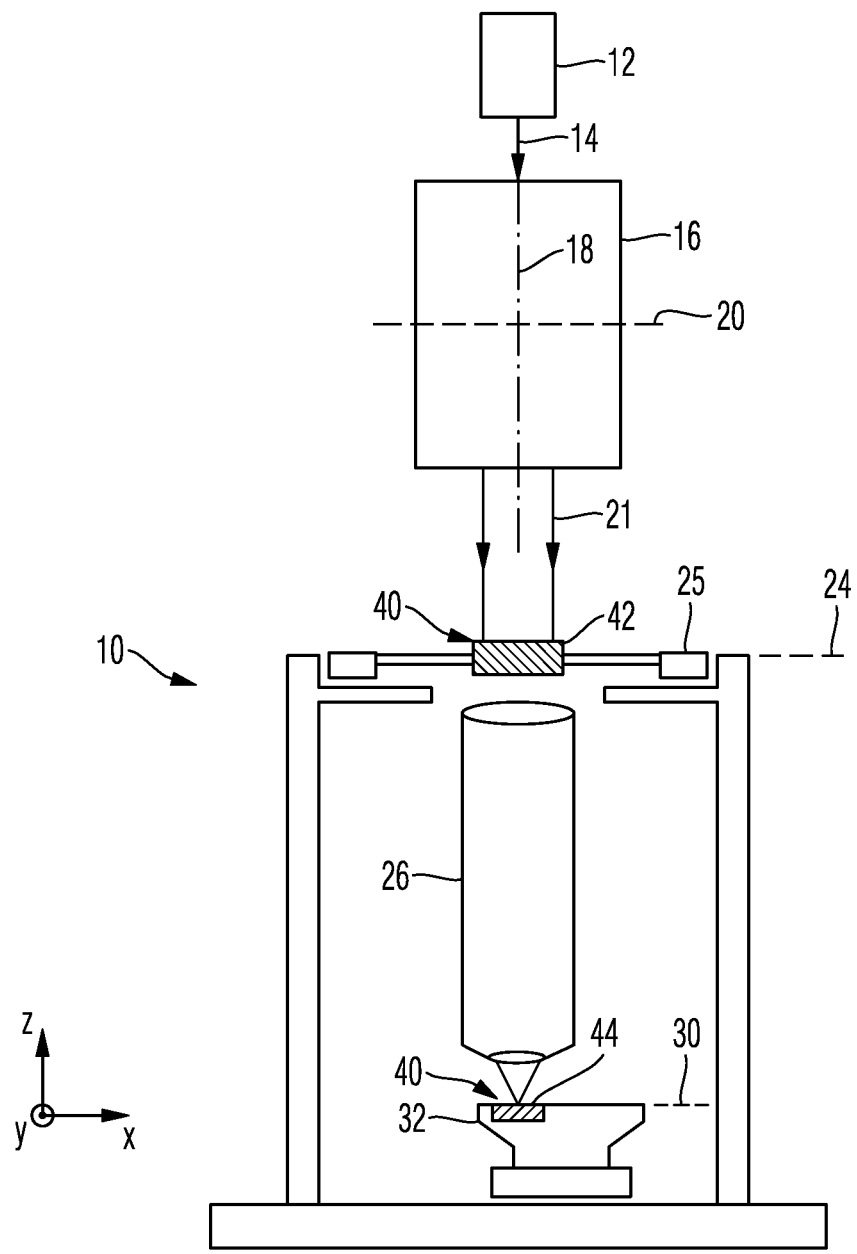
FIG. 2 shows a further embodiment according to the invention of a projection exposure apparatus comprising a measurement system of the abovementioned type.

FIG. 2 shows a further embodiment of the projection exposure apparatus 10 according to the invention. The latter differs from the embodiment in accordance with FIG. 1 in that the measurement system 40 is not integrated into the edge of the reticle displacement stage 25. Rather, the optical module 42 and the detection module 44 of the measurement system 40 in accordance with FIG. 2 are arranged in different planes of the projection exposure apparatus 10 during the measurement process. The optical module 42 is arranged in the reticle plane 24, while the detection module 44 is integrated into the wafer displacement stage 32 in such a way that its detection area is arranged in the wafer plane 30 and thus in a plane that is conjugate with respect to the reticle plane 24.

In accordance with a variant according to FIG. 2, the optical module 42 is designed in the form of a reticle and is loaded instead of a product reticle 22 by the reticle displacement stage 25 in order to carry out the measurement process. The measurement is effected analogously to the procedure described above. In accordance with a further variant of the embodiment according to FIG. 1, it is also possible to integrate the optical module 42 in an edge region of the reticle displacement stage 25 and to use for the measurement a detection module 44 integrated into the wafer displacement stage 32 in accordance with FIG. 2.

Figure 3:
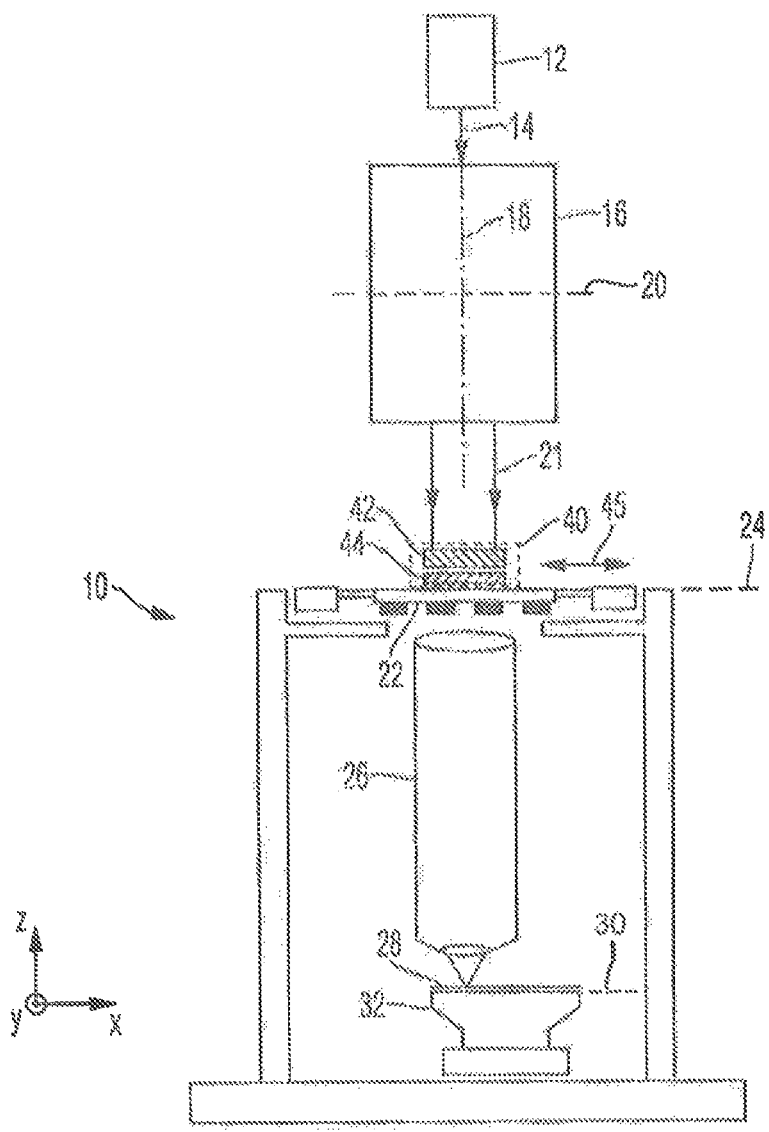
FIG. 3 shows a further embodiment according to the invention of a projection exposure apparatus comprising a measurement system of the abovementioned type.

FIG. 3 illustrates a further embodiment of a projection exposure apparatus 10 according to the invention. The latter differs from the projection exposure apparatus 10 in accordance with FIG. 1 in that the measurement system 40 is not integrated directly into the reticle displacement stage 25, but rather is inserted into the beam path of the illumination radiation 21 just above the reticle plane 24 using a suitable displacement device 45 in order to carry out the measurement. This has the advantage that for the measurement a reticle 22 arranged in the reticle displacement stage 25 need not be removed and at the same time a compact construction of the reticle displacement stage 25 is possible. The arrangement of the measurement system 40 above the reticle plane 24 is effected so close to the reticle plane 24 that the measurement system 40 is situated closer to the reticle plane 24 than to the closest pupil plane 20 of the illumination system 16. Preferably, the distance from the closest pupil plane 20 is more than double the magnitude of the distance from the reticle plane 24.

In the embodiment in accordance with FIG. 3, the optical module 22 and the detection module 44 are arranged close to one another, with the result that the measurement system 40 is present with a compact design. According to an alternative variant, the entire measurement system 40 in accordance with FIG. 3 can also be integrated into the wafer displacement stage 32. In this case, it is necessary to remove the reticle 22 and the wafer 28 before the measurement.

Figure 5:
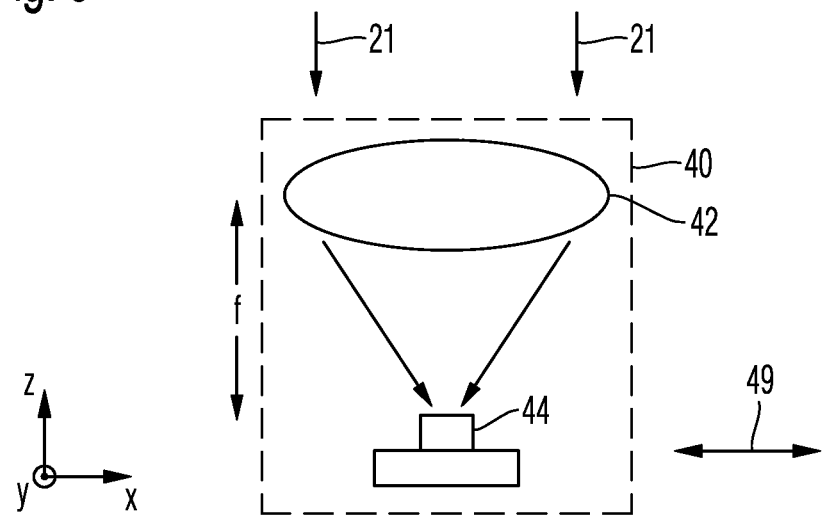
FIG. 5 shows a schematic sectional view of the measurement system in a further embodiment according to the invention.

FIG. 5 shows a further embodiment of the measurement system 40. This embodiment is likewise characterized by a compact design and can be used in the projection exposure apparatus 10 for instance in the variants in accordance with FIG. 1 and FIG. 3. The system 40 in accordance with FIG. 5 comprises a focusing optical element, e.g. in the form of an optical lens element or a focusing mirror, as optical module 42. The detection module 44 is designed as an areally resolving sensor and is arranged at the focal point of the focusing optical element. In the embodiment in accordance with FIG. 5, for measuring the entire illuminating field in the reticle plane 24, the measurement system 40 is displaced successively to different field points by a displacement device 49. In the case of the arrangement of the measurement system 40 in an edge region of the reticle displacement stage 25 analogously to FIG. 1, the reticle displacement stage 25 can serve as displacement device 49. In the case of the arrangement of the measurement system 40 above the reticle plane 24 in accordance with FIG. 3, the displacement device 49 is designed as a separate system.

Figure 6:
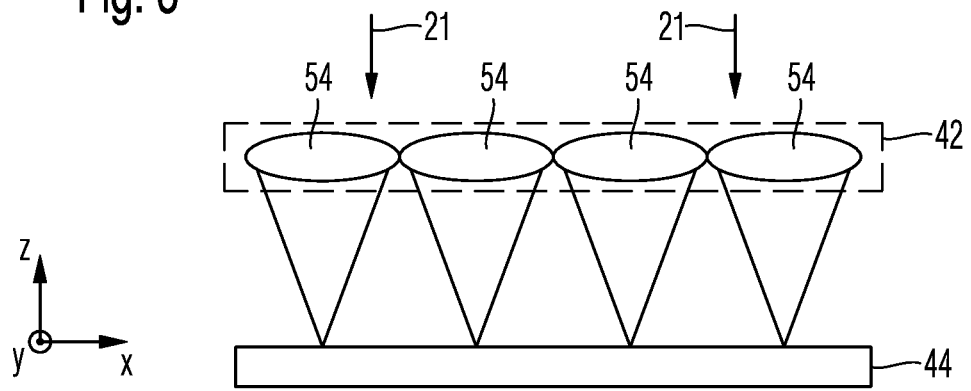
FIG. 6 shows a schematic sectional view of the measurement system in a further embodiment according to the invention.

FIG. 6 illustrates a further embodiment of a measurement system 40 according to the invention. It differs from the measurement system 40 in accordance with FIG. 5 in that the optical module 42 is formed by a two-dimensional arrangement of focusing optical elements 54. The detection module 44 is designed as an areal, spatially resolving sensor and comprises a CCD module, for example. Preferably, the extent of the arrangement of focusing optical elements 54 in the x-y plane extends over the entire illuminated field in the reticle plane 24. It is thus possible to measure the angular distribution of the illumination radiation 22 in the entire illuminated field in parallel.

Figure 7:
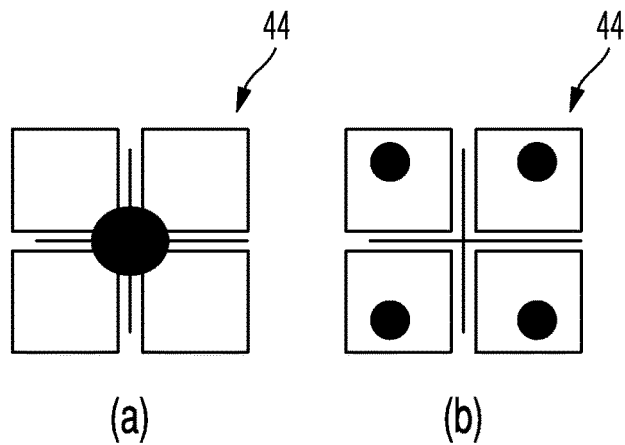
FIG. 7 shows a plan view of a detection module of the measurement system in an embodiment according to the invention.

FIG. 7 shows a further embodiment of the detection module 44 in accordance with FIG. 5. In accordance with this embodiment, the detection module 44 is not embodied as an area sensor, but rather comprises only a limited number of point sensors. Thus, for instance, two or four point sensors can be provided. As illustrated in FIG. 7, the detection module 44 can be embodied as a four-quadrant diode, for instance. Under (a) in FIG. 7, such a four-quadrant diode is illustrated for the case in which the illumination radiation 21 is present as coherent illumination, and for the case of quadrupole illumination under (b). Alternatively, it is also possible to capture the intensity with optical fibers and to carry out detection outside the measurement system 40.

The embodiment of the detection module 44 as illustrated in FIG. 7 makes it possible to detect important information about the illumination radiation 21. This includes, for instance, in the case of (a) information about the energetic centering of the illumination distribution and in the case of (b) information with regard to the balance of the individual poles. The embodiment of the detection module 44 as an arrangement of point sensors has the advantage of low complexity, which facilitates integration and accelerates the measurement process.

Figure 8:
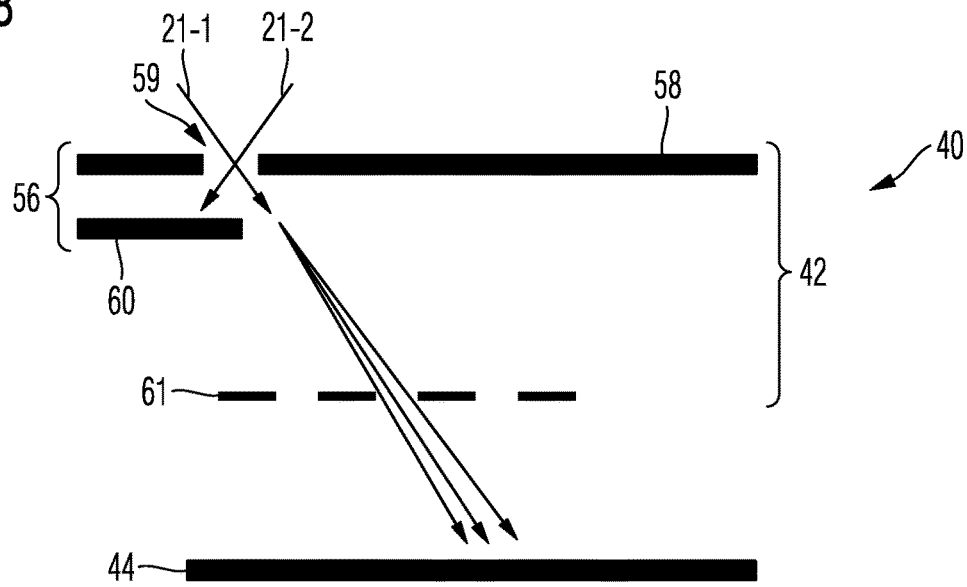
FIG. 8 shows a schematic sectional view of the measurement system in a further embodiment according to the invention.

FIG. 8 illustrates a further embodiment of a measurement system 40 according to the invention. This measurement system, too, comprises an optical module 42 and a detection module 44 in the form of an areally resolving sensor. The optical module 42 comprises a pole selection device 56 and a shadow casting element 61 in the form of a coarse grating, comparable with gratings used in Moire methods. The pole selection device 56 comprises a first stop 58 having a cutout 59, and a second stop 60, which is arranged below the first stop 58 in such a way that it blocks one of the two poles 21-1 or 21-2 when a dipole-type illumination distribution is radiated in. It is thus possible to separately measure the radiation distribution of one of the two poles 21-1 or 21-2.

The radiation of the illumination pole transmitted by the pole selection device 56 thereupon passes through the shadow casting element and is registered by the detection module 44. The divergence of the radiated pole 21-1 is thereupon determined from the position of the transition between a shaded region and an illuminated region on the detector area of the detection module 44.

In accordance with one variant of the optical module 42 in accordance with FIG. 8, a further shadow casting element is arranged in proximity to the detection area of the detection module 44. In this case, a one-dimensionally resolving diode can be used as detection module 44. In accordance with a further variant, the intensity distribution measured by the measurement system 40 according to FIG. 8 is evaluated using phase shifting methods. Here the stops 58 and 60 and/or the shadow casting element 61 and/or a further shadow casting element arranged on the detection area are moved or rotated with respect to one another.

The pole selection device 56 in accordance with FIG. 8 can also be combined with the optical module 42 in accordance with FIG. 4 if the pole selection device 56 is arranged above the two shearing gratings 46 and 48.

Figure 9:
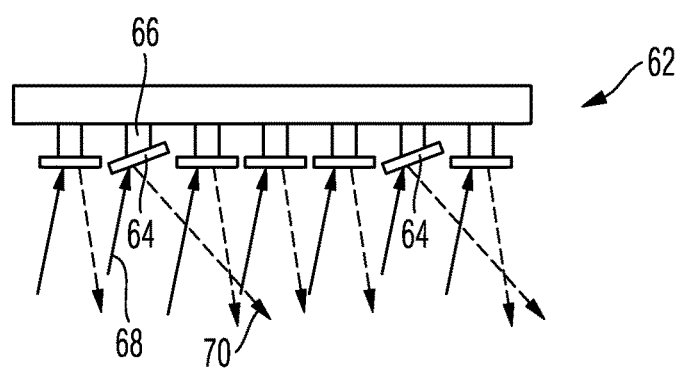
FIG. 9 shows a schematic sectional view of a previously known multimirror array that is optionally employed in the illumination system of a projection exposure apparatus.

The measurement system 40 according to the invention in one of the embodiments described above is particularly suitable for measuring illumination settings generated by illumination systems having a multimirror array. Such a multimirror array, also designated as MMA, is illustrated in FIG. 9 and designated by the reference sign 62. It comprises a two-dimensional array of micromirrors 64, at least some of which can be tilted at least with respect to one axis with tilting devices 66. It is thus possible to manipulate incoming partial beams 68 individually with regard to their direction of propagation in reflection, such that the corresponding emerging partial beams 70 acquire a direction of propagation that can be set individually in each case. Embodiments in which the illumination system of the projection exposure apparatus comprises such a multimirror array are described for example in WO 2009/080279 A1 and WO 2005/026843 A2.

Figure 10:
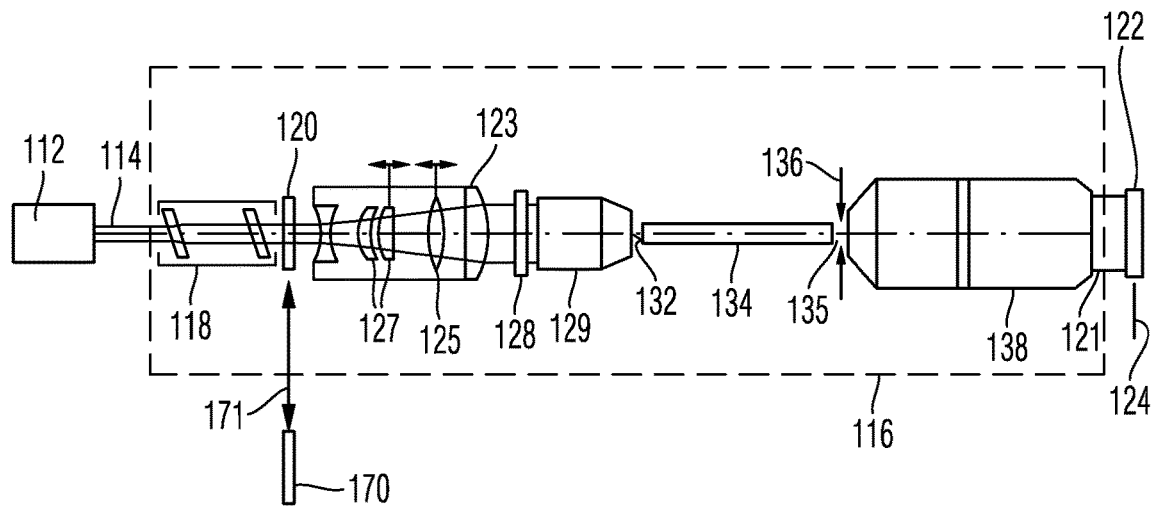
FIG. 10 shows a schematic sectional view of an illumination system of a projection exposure apparatus for microlithography comprising an exchanging device for the replacement according to the invention of a diffractive optical element of the illumination system by a microstructured plate.
Figure 11:
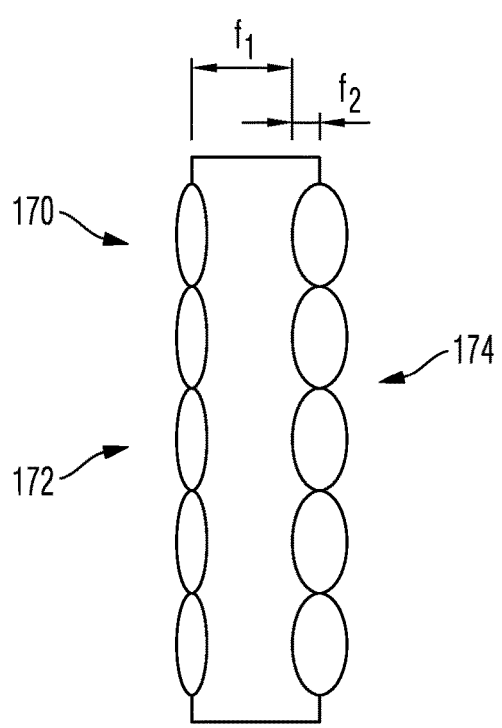
FIG. 11 shows a schematic sectional view of the microstructured plate in accordance with FIG. 10.
Figure 12:
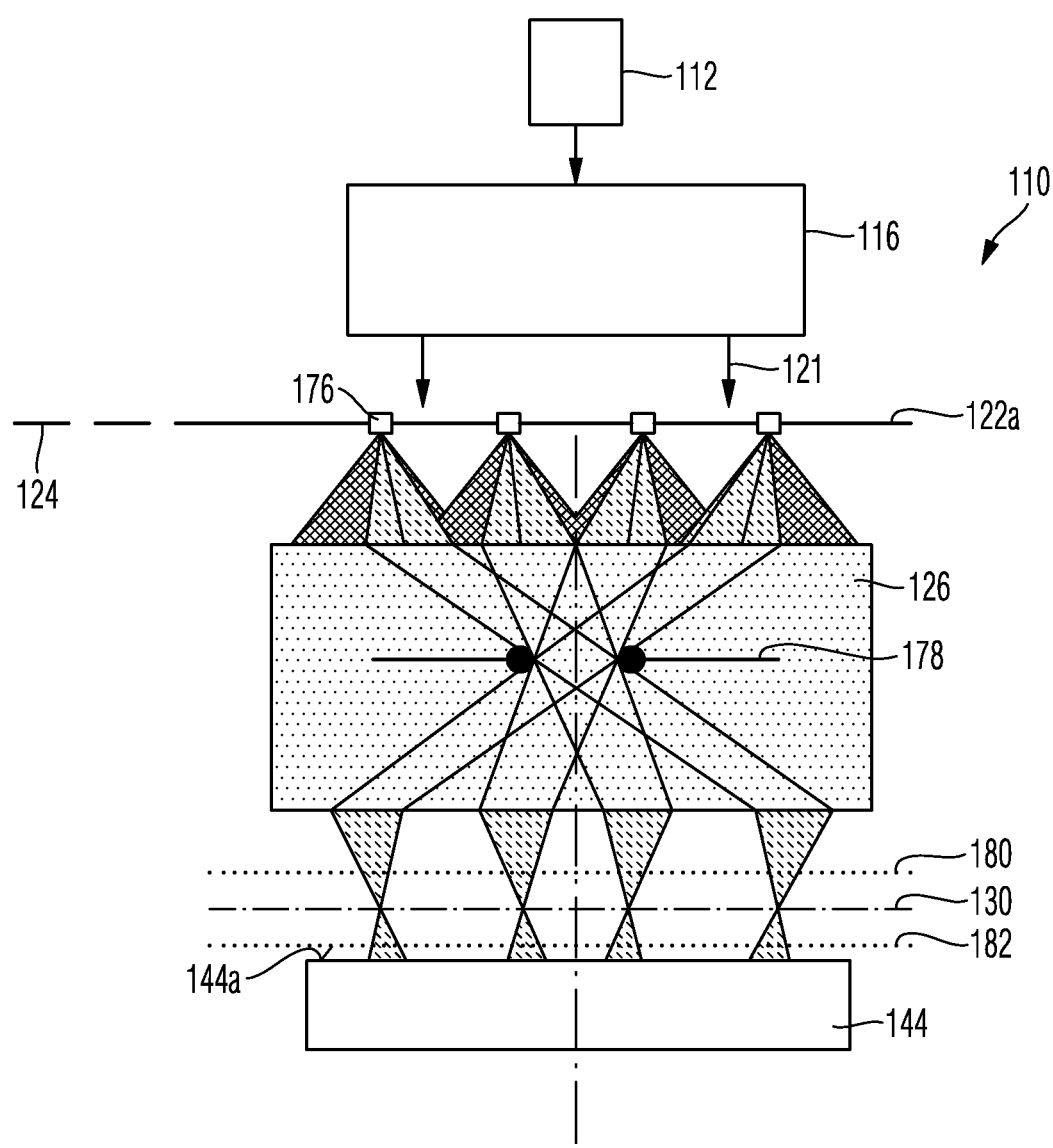
FIG. 12 shows a schematic sectional view of a projection exposure apparatus in a measuring configuration for measuring an angularly resolved intensity distribution in the reticle plane of the projection exposure apparatus.

FIGS. 10 to 12 illustrate a further aspect of the invention. This aspect relates to the measurement of a beam divergence in an illumination system of a projection exposure apparatus for microlithography at a location in the beam path of the illumination system, which location is designated in greater detail below.

FIG. 10 illustrates an example of an illumination system 116 at which the beam divergence is measured with the method according to the invention. Disposed upstream of the illumination system 116 is an irradiation source 112 for generating electromagnetic radiation, for example having a wavelength in the UV wavelength range, such as, for instance, 365 nm, 248 nm or 193 nm. The illumination system 116 comprises a beam expanding optical unit 118, a beam angle redistribution module in the form of a first diffractive optical element 120, a beam structuring element 123, a second diffractive optical element 128, an input coupling optical unit 129, a rod 134, a field stop 136 and a REMA lens 138.

The electromagnetic radiation 114 in the form of an optical radiation beam firstly passes through a beam expanding optical unit 118. The latter expands the beam cross section of the beam. The expanded beam subsequently passes through the first diffractive optical element 120. The diffractive optical element 120 serves as a beam angle redistribution module and has the function of individually deflecting the partial beams of the expanded beam which are parallel to one another upon impinging on the element 120, in accordance with a predefined angular distribution. The function of the beam angle redistribution module therefore lies in generating a desired illumination angle distribution. Instead of the diffractive optical element 120 shown, the beam angle redistribution module can e.g. also be formed with the aid of a multimirror array, the individual mirrors of which are mounted in a tiltable fashion. An illumination system comprising such a beam angle redistribution module is described for example in WO 2005/026843 A2.

The beam of the electromagnetic radiation 114 is thereupon transferred, with the illumination angle distribution impressed by the first diffractive optical element 120 into a downstream pupil plane by the beam structuring module 123. This pupil plane, which is not illustrated in more specific detail, is situated in proximity to the second diffractive optical element 128. The beam structuring module 123 comprises, for the further structuring of the radiation beam, a zoom system 125, schematically represented by a moveable lens element, and a so-called axicon, schematically represented by two optical elements. By moving the axicon elements apart, it is possible to set the inner sigma of an illumination setting, or the boundaries of the cross section of the beam of an illumination setting. Secondly, it is possible to set the outer sigma of the illumination setting, or generally the outer boundary of the beam cross section, by the movement of the zoom or of the lens element illustrated schematically.

With a suitable design of the diffractive optical element 120 and a suitable choice of the position of the axicon elements and of the zoom, it is possible to generate any desired intensity distribution at the output of the beam structuring module 123 in proximity to the second diffractive optical element 128. A field angle distribution is impressed on this intensity distribution in the pupil plane by the second diffractive optical element 128, in order to obtain a desired field shape in a field plane, such as e.g. a rectangular field shape having an aspect ratio of 10:1. This field angle distribution of the beam in the pupil plane is transferred by the downstream input coupling optical unit 129 into an illumination field 132 at the input of the rod 134.

In this case, the illumination field 132 at the input of the rod 134 is situated in a field plane of the illumination optical unit 116 and has an illumination angle distribution having a maximum illumination angle value, which generally, but not necessarily, corresponds to the numerical aperture of the preceding input coupling optical unit 129. The illumination field 132 at the input of the rod 134 is transferred into a field 135 at the output of the rod 134. In this case, the maximum illumination angles in the field 135 of the rod output correspond to those in the field 132 of the rod input. As a result of multiple total internal reflections at the walls of the rod 134, secondary light sources having the field shape of the field 132 at the rod entrance as the shape of each individual secondary light source arise at the rod exit in the exit pupils of the field points of the field 135. As a result of this kaleidoscope effect of the rod 134, the field 132 is homogenized with regard to the intensity distribution over the field, since as it were the light of many secondary light sources is superimposed in the field 132.

The field stop 136 delimits the field 135 in the lateral extent thereof and provides for a sharp bright-dark transition of the field. The downstream REMA lens 138, as it is called, images the field 135 onto a reticle 122 arranged in the reticle plane 124. In this case, the bright-dark edges of the field stop 136 are transferred sharply into the reticle plane 124.

The illumination system 116 comprises an exchanging device, which is illustrated with a double-headed arrow 171 in FIG. 10. The exchanging device 171 is configured for exchanging the first diffractive optical element 120 for a divergence amplification module according to the invention in order to carry out the divergence measurement. In other embodiments of illumination systems, not explained in greater detail here, it may be necessary to exchange a plurality of optical elements in order to carry out the divergence measurement. In accordance with one embodiment, the divergence amplification module is configured as 4f lens element array. As an example of such a 4f lens element array, a microstructured plate 170 is described in greater detail below with reference to FIG. 11. A macroscopic telephoto lens is also considered as a further example of a 4f lens element array.

The microstructured plate 170 illustrated schematically in greater detail in FIG. 11 comprises two microlens element arrays 172 and 174 spaced apart from one another. The two microlens element arrays 172 and 174 are in each case embodied two-dimensionally, wherein the focal length $f_1$ of the first microlens element array 172 is greater than the focal length $f_2$ of the second microlens element array 174. The microlens element arrays 172 and 174 are opposite one another at the distance $d=f_1+f_2$. In order to ensure an optimum integration into the projection exposure apparatus, the microstructured plate 170 is produced with the dimensions of the first diffractive optical element 120. When the microstructured plate 170 is arranged at the location of the first diffractive optical element 120 in the beam path of the illumination optical unit 116, the plate 170 fulfils the function of a telescope optical unit and thus magnifies the divergence of the incoming beam of the electromagnetic radiation 114. The beam size changes upon passing through the plate 170 in accordance with $m=f_2:f_1$, while the divergence is proportional to 1:m.

As a result of the dimensioning of f1>f2, as mentioned above, the beam divergence can be magnified using the plate 170. This beam divergence magnification makes it possible to carry out an angular distribution measurement for instance using a pupil measuring device already known to the person skilled in the art from the prior art, the functioning of said pupil measuring device being illustrated in FIG. 12. In accordance with one embodiment according to the invention, the angular distribution measurement is carried out using one of the measurement systems 140 according to the invention which are presented below and have already been described above. This can be effected using a measurement system 40 which comprises the optical module 42 in accordance with FIG. 4 and a detection module in one of the arrangements in accordance with FIGS. 1 to 3. That is to say that at least the optical module 42 in accordance with FIG. 4 is arranged in the reticle plane 124 or just above the latter. Furthermore, the angular distribution measurement can be effected using one of the measurement systems 40 shown in FIG. 5 and FIG. 6 in an arrangement in accordance with FIG. 1 or FIG. 3. In this case, the measurement system as a whole is arranged in the reticle plane 124 or just above the latter.

Furthermore, in principle, a measurement of the beam divergence at the location of the first diffractive optical element 120 can also be effected, for example by the measurement system 40 that results from the combination of the measurement module 42 in accordance with FIG. 4 with a detection module 44 or the measurement system in accordance with FIG. 5 or FIG. 6 being inserted into the beam path of the illumination system 116 in the place of the first diffractive optical element.

FIG. 12 schematically shows a projection exposure apparatus 110 having the radiation source 112 and the illumination system 116. The projection exposure apparatus 110 furthermore comprises a projection lens 126 and an area-resolving detection module 144 integrated into a wafer displacement stage. For pupil measurement, a special measurement reticle 122a is loaded into the reticle plane 124. The measurement reticle 122a has a multiplicity of punctiform test structures 176, which can be embodied either as so-called pinholes or else as opaque punctiform structures.

If the detection module 144 is then arranged in a conjugate pupil plane at a position above or below the image plane 130 of the projection lens 126, the intensity distribution in a pupil plane 178 of the projection lens 126 is generated on the detection area 144a of the detector module 144. Said intensity distribution is also designated as "pupilogram" in the general part of the description. The position of the detection module 144 above the image plane 130 is also designated as intrafocal position and is identified by the reference sign 180 in FIG. 12. The position below the image plane 130 is analogously designated as extrafocal position 182.

The intensity distribution measured by the detection module 144 when the latter is arranged in the position 180 or 182 corresponds to the angular distribution in the plane in which the first diffractive optical element 120 is usually arranged. However, the measurement accuracy of the method described with reference to FIG. 12 does not suffice for the purposes of determining the divergence of the electromagnetic radiation 114 at the output of the beam expanding optical unit 118. At the output of the beam expanding optical unit 118, the beam divergence is typically 1 mrad, which corresponds approximately to a divergence of 20 msigma (FWHM) in the case of a long zoom focal length. In the case of the pupilogram measurement using the arrangement from FIG. 12, 1 pixel of the detector module corresponds to approximately 10 msigma, i.e. changes in divergence of the relevant order of magnitude of approximately 0.1 mrad are hardly measurable.

In order to solve this problem, as mentioned above, the microstructured plate 170, instead of the diffractive optical element 120, is inserted into the beam path directly at the output of the beam expanding optical unit 118. By virtue of the beam expansion effected thereby, using the arrangement from FIG. 12 the beam divergence can now be measured with an accuracy which suffices for carrying out the optimization of optical proximity corrections on product reticles as described in the general part of the description.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

LIST OF REFERENCE SIGNS

10 Projection exposure apparatus
12 Radiation source
14 Electromagnetic radiation
16 Illumination system
18 Optical axis
20 Pupil plane
21 Illumination radiation
21-1 First pole
21-2 Second pole
22 Reticle
24 Reticle plane
25 Reticle displacement stage
26 Projection lens
28 Wafer
30 Wafer plane
32 Wafer displacement stage
40 Measurement system
42 Optical module
44 Detection module
45 Displacement device
46 First diffraction grating
48 Second diffraction grating
49 Displacement device
50 First partial beam
50-1 Pivoted partial beam
52 Second partial beam
52-2 Pivoted partial beam
54 Focusing optical element
56 Pole selection device
58 First stop
59 Cutout
60 Second stop
61 Shadow casting element
62 Multimirror array
64 Micro mirror
66 Tilting device
68 Incoming partial beam
70 Emerging partial beam
110 Projection exposure apparatus
112 Radiation source
114 Electromagnetic radiation
116 Illumination system
118 Beam expanding optical unit
120 First diffractive optical element
121 Illumination radiation
122 Reticle
122a Measurement reticle
123 Beam structuring module
124 Reticle plane
125 Zoom system
126 Projection lens
127 Axicon
128 Second diffractive optical element
129 Input coupling optical unit
130 Image plane
132 Illumination field
134 Rod
135 Field
136 Field stop
138 REMA lens
144 Detection module
144a Detection area
170 Microstructured plate
171 Exchanging device
172 First microlens element array
174 Second microlens element array
176 Test structure
178 Pupil plane
180 Intrafocal position
182 Extrafocal position

The invention claimed is:

1. A method for measuring an angularly resolved intensity distribution in a reticle plane of a projection exposure apparatus for microlithography comprising an illumination system, which is configured for irradiating a reticle arranged in the reticle plane, and a projection lens for imaging features on the reticle into a wafer plane, comprising:
arranging an optical module at a reticle displacement stage of the projection exposure apparatus, such that it is arranged in a beam path of the projection exposure apparatus,
arranging a spatially resolving detection module in a region of a field plane of the apparatus such that the detection module is at a smaller distance from the field plane than from a pupil plane of the illumination system closest to the detection module and from a pupil plane of the projection lens closest to the detection module, wherein the optical module and the detection module are both arranged in a region of the field plane,
radiating electromagnetic radiation onto the optical module with the illumination system, and
determining an angularly resolved intensity distribution of the radiated radiation from a signal recorded by the detection module.

2. The method according to claim 1,
wherein the optical module is arranged in a region of the reticle plane or another field plane such that the optical module is at a smaller distance from the reticle plane or the other field plane than from a pupil plane of the apparatus closest to the optical module.

3. The method according to claim 1,
wherein the optical module is arranged in the reticle plane during the measuring.

4. The method according to claim 1,
wherein the optical module comprises two diffraction gratings arranged successively in the beam path of the radiation.

5. The method according to claim 1,
wherein a spatial coherence function is recorded by the detection module and the spatial coherence function is converted into the angularly resolved intensity distribution in the reticle plane.

6. The method according to claim 1,
wherein the optical module comprises a focusing optical element configured for focusing the radiated radiation onto the detection module.

7. The method according to claim 1,
further comprising, for measuring the angularly resolved intensity distribution, inserting a measurement system comprising the optical module and the detection module into the beam path of the radiated radiation upstream of a reticle arranged in the reticle plane.

8. The method according to claim 1,
wherein the optical module is fixed to an edge region of a reticle displacement stage of the projection exposure apparatus.

9. The method according to claim 1,
wherein the detection module comprises at least two point sensors separated from one another.

10. The method according to claim 1,
wherein the optical module comprises a shadow casting element, which is at least partly non-transmissive to the radiated radiation, such that at least one shaded region is generated on the detection module and, for determining the angularly resolved intensity distribution, the position of a transition from the shaded region to an unshaded region adjacent to the shaded region is determined by the detection module.

11. The method according to claim 1,
wherein the optical module has a pole selection device, which comprises a pinhole stop and a blocking element for blocking part of the radiated radiation, and the blocking element is offset with respect to the pinhole stop in a direction transversely with respect to the reticle plane.

12. The method according to claim 1,
wherein the optical module is arranged in an edge region of the reticle displacement stage.

13. A method for measuring an angularly resolved intensity distribution in a reticle plane of a projection exposure apparatus for microlithography comprising an illumination system, which is configured for irradiating a reticle arranged in the reticle plane, and a projection lens for imaging features on the reticle into a wafer plane, comprising:
arranging an optical module in a beam path of the projection exposure apparatus, the optical module comprising two diffraction gratings arranged successively in the beam path of the radiation,
arranging a spatially resolving detection module in a region of a field plane of the apparatus such that the detection module is at a smaller distance from the field plane than from a pupil plane of the illumination system closest to the detection module and from a pupil plane of the projection lens closest to the detection module,
radiating electromagnetic radiation onto the optical module with the illumination system, and
determining an angularly resolved intensity distribution of the radiated radiation from a signal recorded by the detection module.

14. The method of claim 1, wherein the field plane comprises the reticle plane.

15. A method for measuring an angularly resolved intensity distribution in a reticle plane of a projection exposure apparatus for microlithography comprising an illumination system, which is configured for irradiating a reticle arranged in the reticle plane, and a projection lens for imaging features on the reticle into a wafer plane, comprising:
arranging an optical module at a reticle displacement stage of the projection exposure apparatus, such that it is arranged in a beam path of the projection exposure apparatus, wherein the optical module is arranged in the reticle plane during the measuring,
arranging a spatially resolving detection module in a region of a field plane of the apparatus such that the detection module is at a smaller distance from the field plane than from a pupil plane of the illumination system closest to the detection module and from a pupil plane of the projection lens closest to the detection module,
radiating electromagnetic radiation onto the optical module with the illumination system, and
determining an angularly resolved intensity distribution of the radiated radiation from a signal recorded by the detection module.

16. A method for measuring an angularly resolved intensity distribution in a reticle plane of a projection exposure apparatus for microlithography comprising is an illumination system, which is configured for irradiating a reticle arranged in the reticle plane, and a projection lens for imaging features on the reticle into a wafer plane, comprising:
fixing an optical module to an edge region of a reticle displacement stage of the projection exposure apparatus, such that it is arranged in a beam path of the protection exposure apparatus,
arranging a spatially resolving detection module in a region of a field plane of the apparatus such that the detection module is at a smaller distance from the field plane than from a pupil plane of the illumination system closest to the detection module and from a pupil plane of the projection lens closest to the detection module,
radiating electromagnetic radiation onto the optical module with the illumination system, and
determining an angularly resolved intensity distribution of the radiated radiation from a signal recorded by the detection module.

\* \* \* \* \*

UNITED STATES PATENT AND TRADEMARK OFFICE
CERTIFICATE OF CORRECTION

PATENT NO. : 9,915,871 B2
APPLICATION NO. : 14/796328
DATED : March 13, 2018
INVENTOR(S) : Wolfgang Emer et al.

Page 1 of 1

It is certified that error appears in the above-identified patent and that said Letters Patent is hereby corrected as shown below:

In the Claims

Column 18, Line 37, Claim 16, delete "is an" and insert -- an --, therefor.

Signed and Sealed this
Twenty-fourth Day of September, 2019

Andrei Iancu
*Director of the United States Patent and Trademark Office*